United States Patent [19]
Ohwada et al.

[11] Patent Number: 5,343,291
[45] Date of Patent: Aug. 30, 1994

[54] METHOD AND APPARATUS FOR MEASURING AN INTERVAL BETWEEN TWO OBJECTS

[75] Inventors: Mitsutoshi Ohwada, Yokohama; Masakazu Matsugu, Atsugi; Shigeyuki Suda, Yokohama; Minoru Yoshii, Tokyo; Yukichi Niwa, Narashino; Noriyuki Nose, Machida; Kenji Saitoh, Yokohama; Masanobu Hasegawa, Atsugi, all of Japan

[73] Assignee: Canon Kabushiki Kaisha, Tokyo, Japan

[21] Appl. No.: 851,109

[22] Filed: Mar. 16, 1992

Related U.S. Application Data

[63] Continuation of Ser. No. 770,138, Oct. 2, 1991, abandoned, which is a continuation of Ser. No. 630,759, Dec. 21, 1990, abandoned, which is a continuation of Ser. No. 311,131, Feb. 15, 1989, abandoned.

[30] Foreign Application Priority Data

Feb. 16, 1988 [JP] Japan ................................. 63-033206
Sep. 9, 1988 [JP] Japan ................................. 63-225810

[51] Int. Cl.$^5$ ............................................. G01B 11/02
[52] U.S. Cl. ..................................... 356/356; 356/401
[58] Field of Search ............... 356/355, 356, 363, 400, 356/401, 357, 359

[56] References Cited

U.S. PATENT DOCUMENTS 4,656,347  4/1987  Une et al. ................... 356/356 X
4,988,197  1/1991  Ishisashi et al. ................ 356/356

FOREIGN PATENT DOCUMENTS 0220571  5/1987  European Pat. Off. .
3719538  12/1987 Fed. Rep. of Germany .

OTHER PUBLICATIONS

Feldman et al., "Application of Zone Plates to Alignment in X-Ray Lithography," Optical Engineering, Mar.–Apr., 1983, vol. 22, No. 2, pg. 203–207.

Primary Examiner—Davis L. Willis
Assistant Examiner—La Charles Keesee
Attorney, Agent, or Firm—Fitzpatrick, Cella, Harper & Scinto

[57] ABSTRACT

A device for measuring an interval between two plate-like objects includes a light source for projecting a light toward the objects, a detector for detecting a position of incidence, upon a predetermined surface, of the light projected by the light source and deflected by the two objects, and a calculating portion for measuring the interval of the two objects on the basis of the detection by the detector.

34 Claims, 12 Drawing Sheets

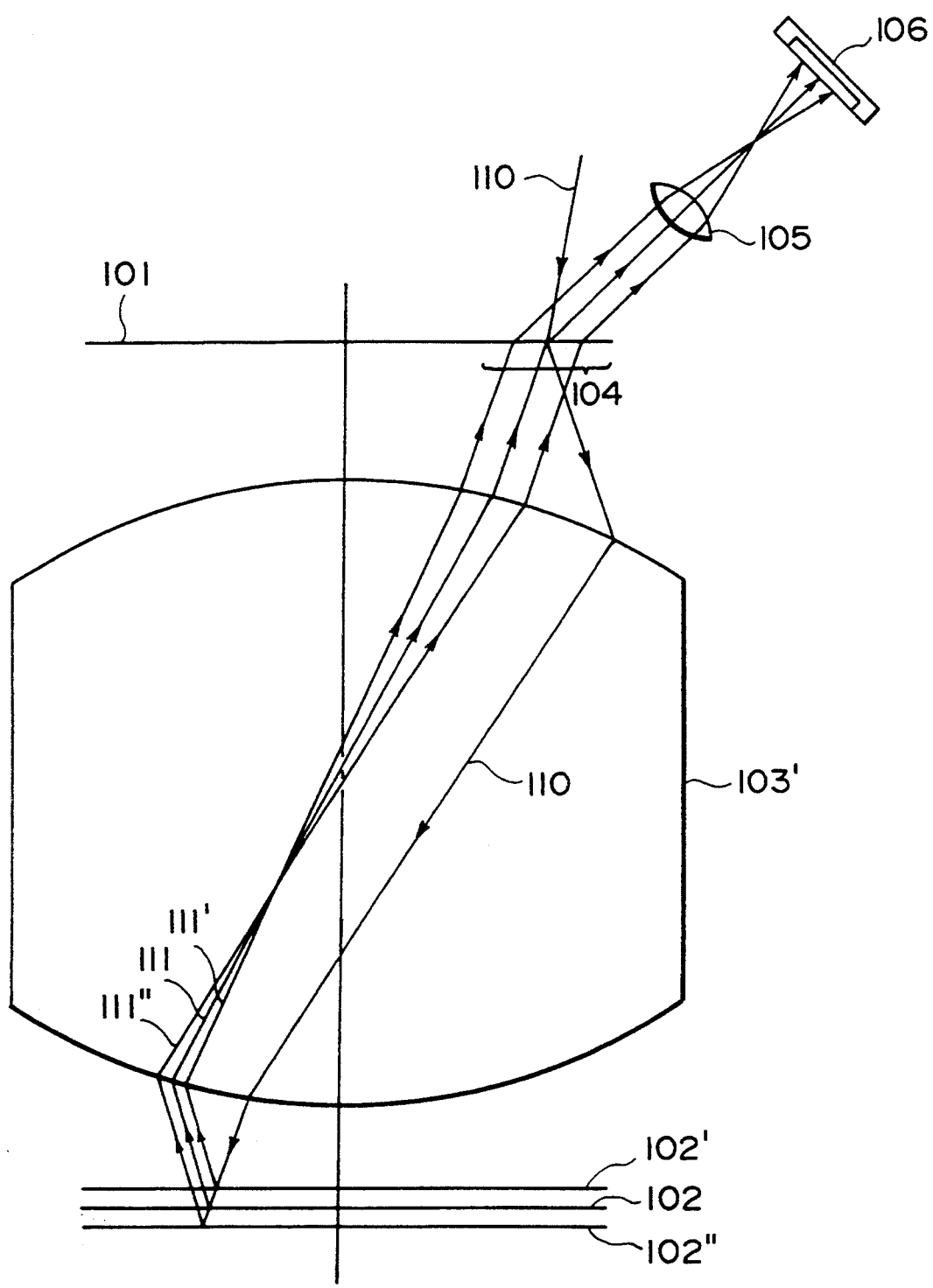
F I G. 7

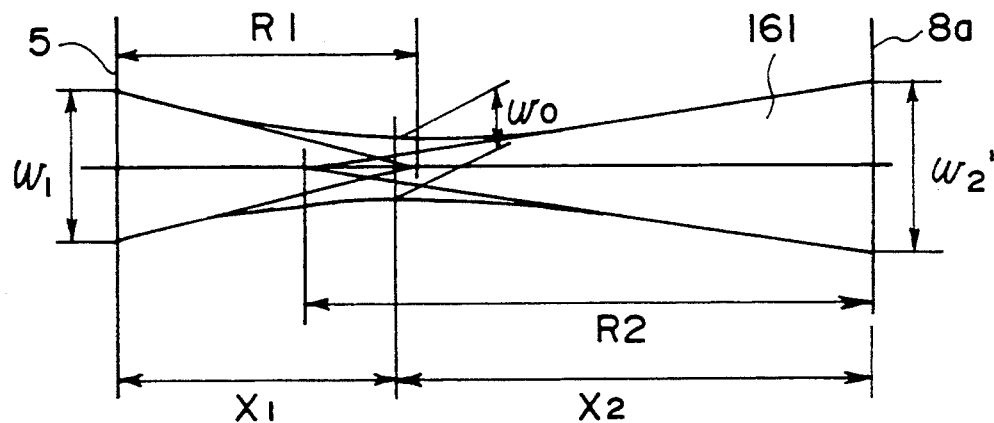
F I G. 11
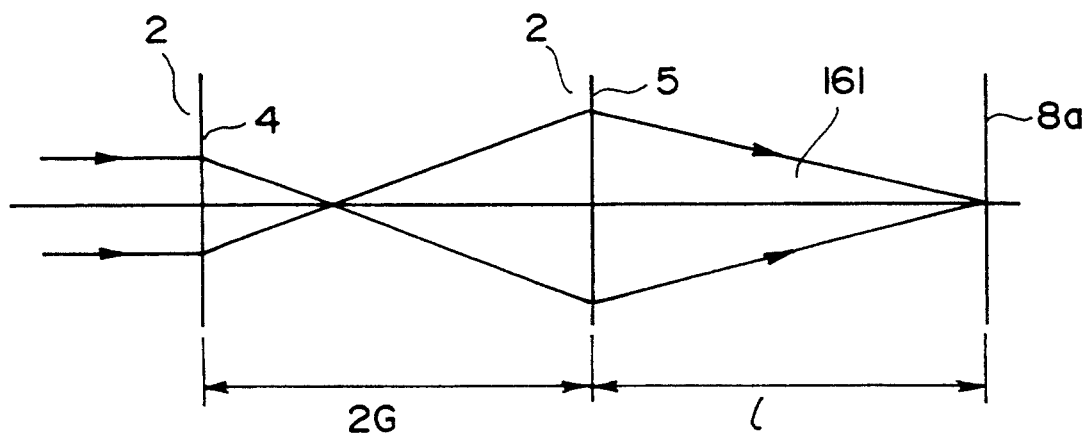
F I G. 12A
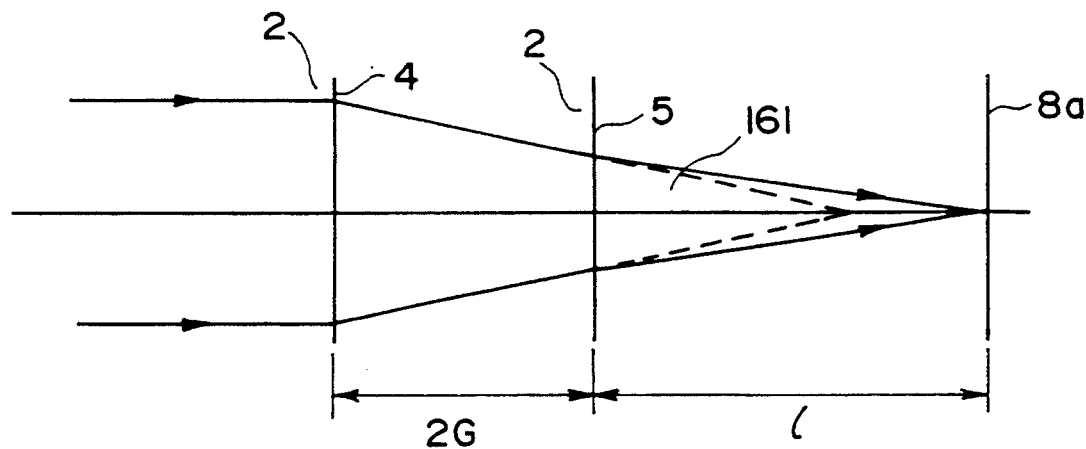
F I G. 12B

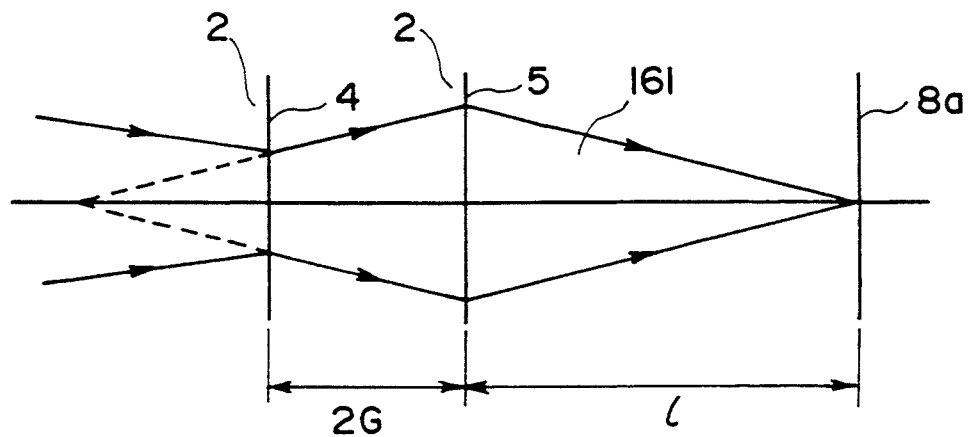
F I G. 13A
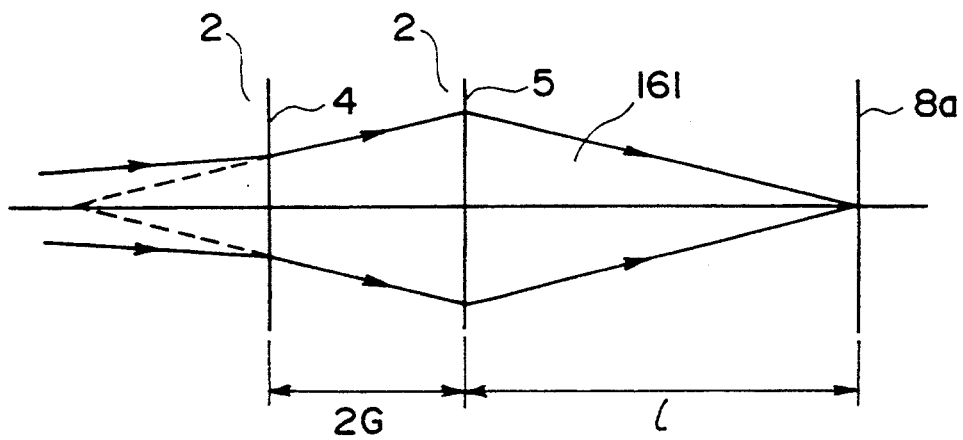
F I G. 13B
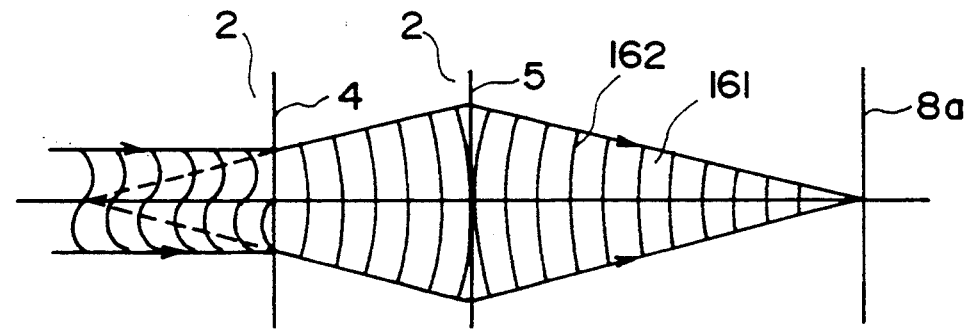
F I G. 13C

METHOD AND APPARATUS FOR MEASURING AN INTERVAL BETWEEN TWO OBJECTS

This application is a continuation prior application, Ser. No. 07/770,138 filed Oct. 2, 1991, which application is a continuation of prior application, Ser. No. 07/630,759 filed Dec. 21, 1990, which application is a continuation of prior application, Ser. No. 07/311,131 filed Feb. 15, 1989, all now abandoned.

FIELD OF THE INVENTION AND RELATED ART

This invention relates to a method and apparatus for measuring an interval between two objects with high precision, which is particularly suitably for use in a semiconductor microcircuit device manufacturing apparatus, for example, to measure a gap or interval between a mask and a wafer for control of the same to a desired value.

In semiconductor device manufacturing apparatuses, an interval measuring device is used to measure the gap or interval between a mask and a wafer and, after adjustment of the same, a pattern of the mask is transferred onto the wafer by exposure. This assures high-precision pattern transfer. FIG. 1 is a schematic view of a gap measuring device as proposed in Japanese Laid-Open Patent Application, Laid-Open No. Sho 61-111402. In this example, a mask M (first object) and a wafer W (second object) are disposed opposed to each other, and by using a lens L1 a light is focused at a point Ps which is between the mask M and the wafer W.

In this example, the light is reflected by the mask M surface and by the wafer W surface, and the reflected lights are projected and focused by another lens L2 at points $P_W$ and $P_M$ on a screen S surface. The gap or interval between the mask M and the wafer W can be measured by detecting the interval between the light spots $P_W$ and $P_M$ on the screen S surface.

However, in such a system, each of the reflected lights from the mask and the wafer bears only the information related to the position of the mask or wafer. Thus, two lights are necessary for gap measurement. This is complicated.

SUMMARY OF THE INVENTION

It is an object of the present invention to provide a method and apparatus for measuring an interval between two objects such as a first plate-like object and a second plate-like object disposed opposed to each other, with high precision and without a complicated apparatus or method for performing this measurement.

Briefly, in accordance with an aspect of the present invention, the interval of two objects is measured by use of a light which bears positional information related to both of these objects.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 7 is a schematic representation of an optical arrangement according to a fifth embodiment of the present invention.

FIG. 11 is an explanatory view, showing light emanating from a second physical optic element provided on a first object, in accordance with an aspect of the present invention, as the emanating light is considered wave-optically.

FIGS. 12A and 12B and FIGS. 13A–13C are schematic representations, respectively, showing other forms of physical optic elements usable in the present invention.

DESCRIPTION OF THE PREFERRED EMBODIMENTS

Figure 1:
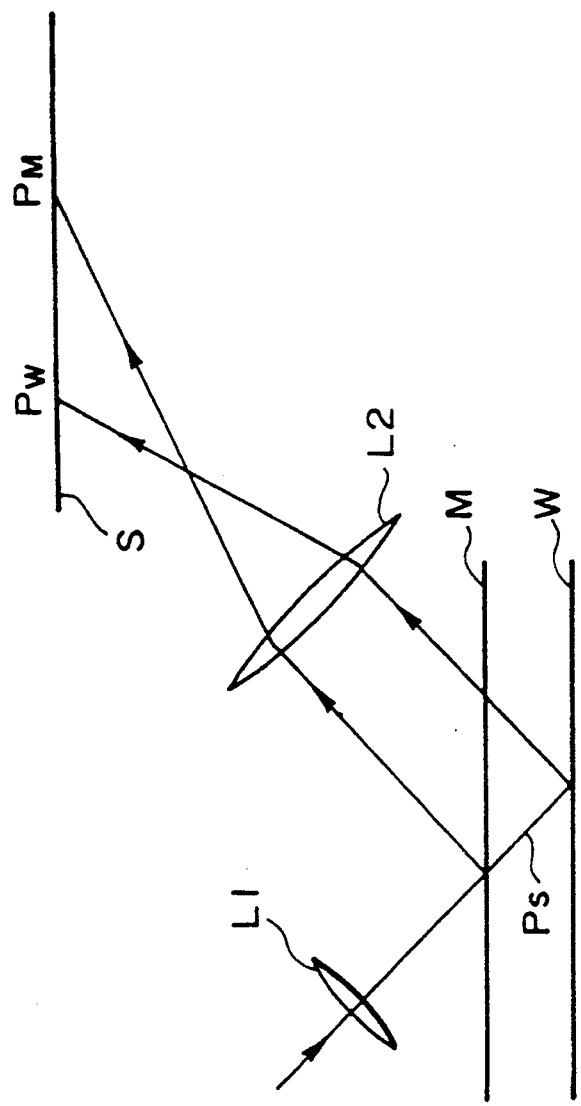
FIG. 1 is a schematic view of an optical arrangement, for explicating the principle of an interval measuring method of a known type.
Figure 2:
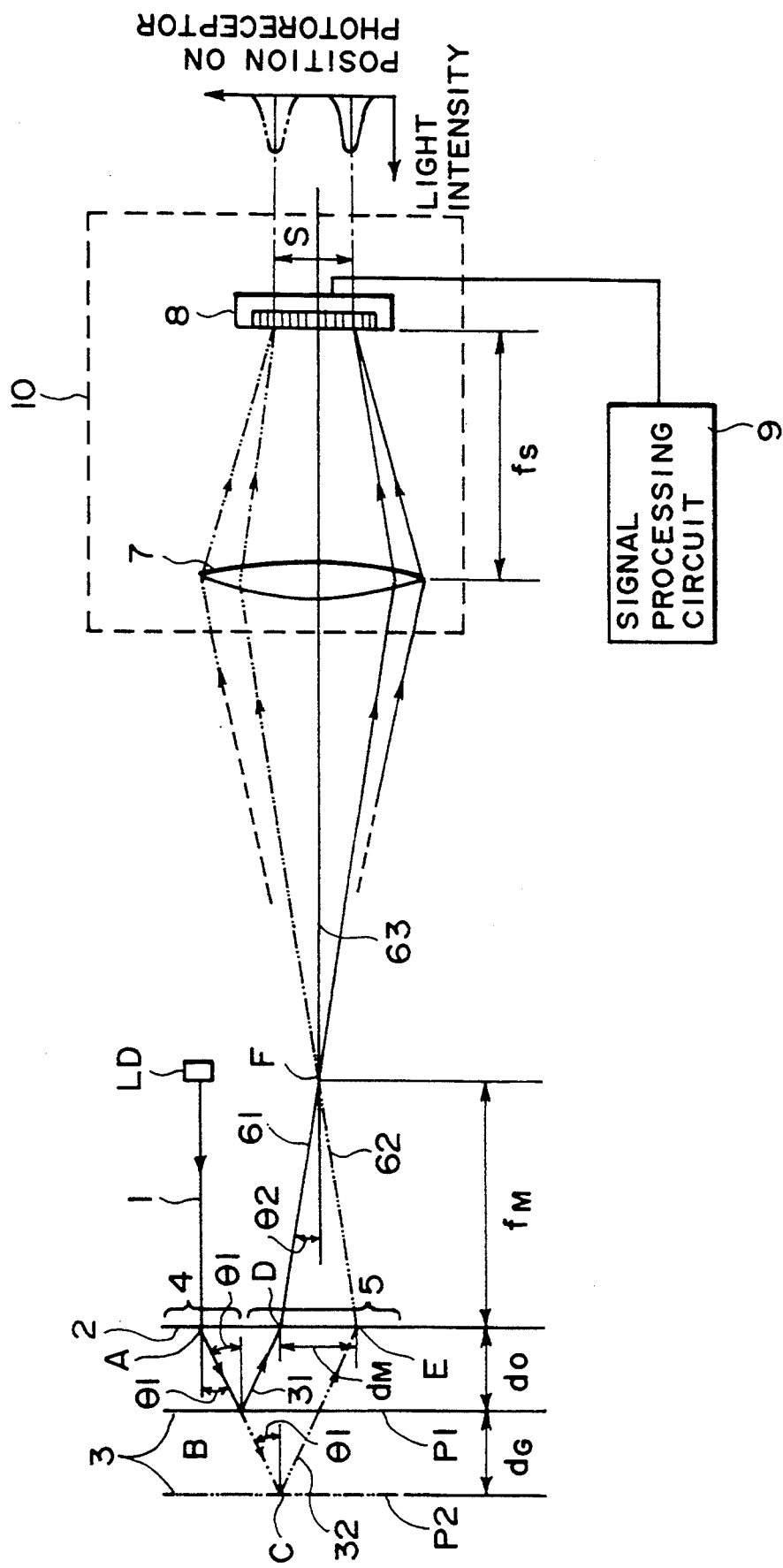
FIG. 2 is a schematic view of an optical arrangement according to a first embodiment of the present invention.
Figure 3:
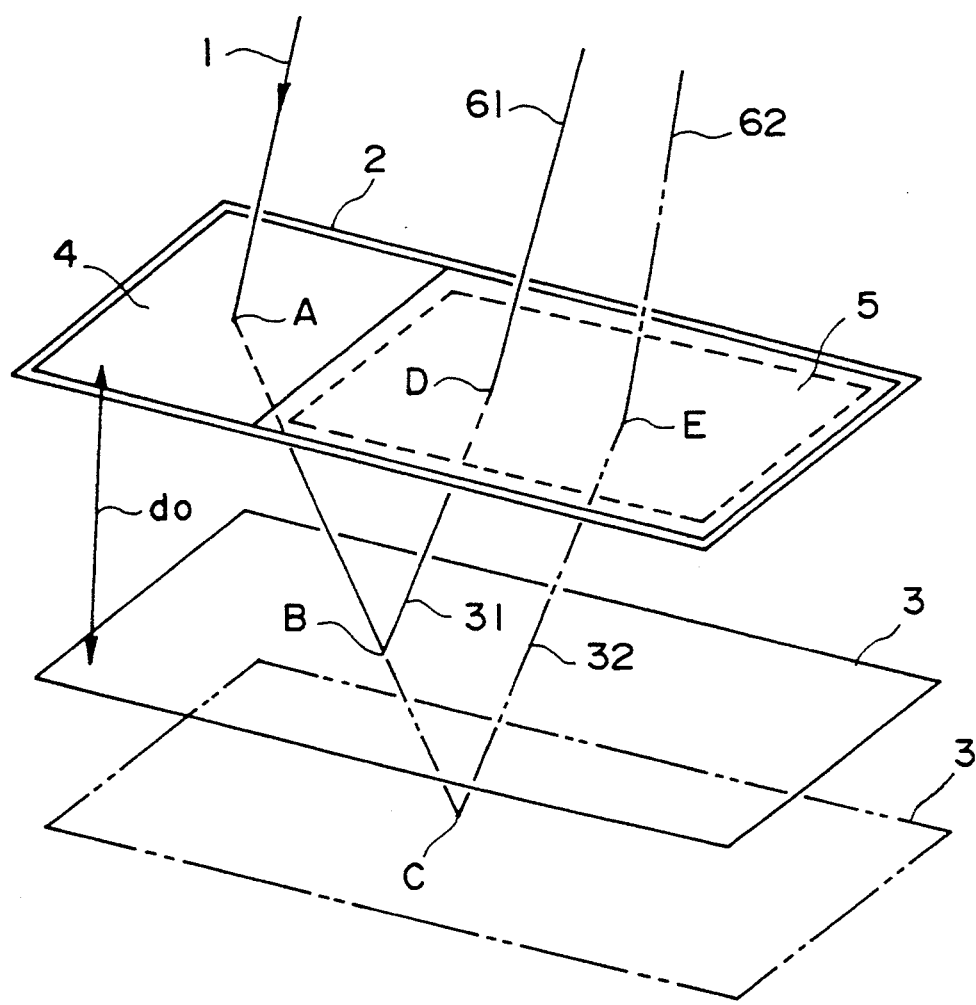
FIG. 3 is a schematic and perspective view showing a major portion of the first embodiment, around used physical optic elements.

FIG. 2 is a schematic representation of an optical arrangement according to an embodiment of the present invention, wherein the invention is applied to a gap measuring device, usable in a semiconductor microcircuit device manufacturing exposure apparatus, for measuring a gap between a mask and a wafer. FIG. 3 is a perspective view schematically showing physical optic elements and a portion around them, in the device of the FIG. 2 embodiment.

Denoted at 1 is a laser beam supplied from a semiconductor laser LD. The semiconductor laser LD may be replaced by a different type of laser device such as a He-Ne laser, for example. Denoted at 2 is a first object which is a mask, for example. Denoted at 3 is a second object which is a wafer, for example. Denoted at 4 and 5 are first and second physical optic elements which are provided in a portion of the mask 2. Each of these physical optic elements 4 and 5 is provided by a diffraction grating or zone plate, for example. Denoted at 7 is a condensing lens having a focal length fs and an optical axis 63.

Denoted at 8 is a light receiving means which is disposed at a focal point position of the condensing lens 7. The light receiving means comprises a line sensor, PSD or otherwise and functions to detect the position of the center of gravity of a received light. Denoted at 9 is a signal processing circuit which is operable to determine, by using signals from the light receiving means 8, the position of the center of gravity of the light incident on the light receiving means 8, and to detect by calculation the gap $d_0$ between the mask 2 and the wafer 3 in a manner which will be described later.

Denoted generally at 10 is an optical probe comprising the condensing lens 7 and the light receiving means 8 as well as the signal processing circuit 9, as required, which optical probe is movable relatively to the mask 2 and the wafer 3.

The light 1 (wavelength $\lambda = 830$ nm in this example) from the semiconductor laser LD is perpendicularly incident at a point A on the surface of a first Fresnel zone plate provided in a portion of the mask 2. The light incident on the first Fresnel zone plate 4 is diffracted thereby, and diffraction light of a predetermined order or orders, being diffracted at an angle $\theta 1$ is reflected at a point B (C) on the wafer 3 surface. Reference numeral 31 denotes such a reflection light from the wafer 3 when it is at a position P1 which is at a distance (interval) $d_0$ from the mask 2. Reference numeral 32 denotes such a reflection light from the wafer 3 when it is at a position P2 which is at a distance $d_G$ from the position P1.

The reflected light from the wafer 3 is incident at a point D (or E as the wafer 3 is at the position P2) on the surface of a second Fresnel zone plate 5 provided in a portion of the first object (mask) 2.

The second Fresnel zone plate 5 has an optical function by which the angle of emission of a diffraction light emanating therefrom changes in accordance with the position of incidence of light impinging on the second Fresnel zone plate, like the function of a condensing lens.

Diffraction light 61 (or 62 as the wafer 3 is at the position P2) of a predetermined order or orders, being diffracted from the second Fresnel zone plate 5 at an angle $\theta 2$, is directed through the condensing lens 7 onto the surface of the light receiving means 8. By using the position of the center of gravity of the received light 61 (or 62) on the surface of the light receiving means 8, the gap or interval between the mask 2 and the wafer 3 can be detected by calculation.

In this embodiment, each of the first and second Fresnel zone plates 4 and 5 both of which are provided in a portion of the mask 2, has a predetermined pitch. Also, the angle of diffraction $\theta 1$ or $\theta 2$ of the diffraction light of a predetermined order or orders (e.g. positive and negative first orders) produced by reception of light by each Fresnel zone plate, can be detected in preparation.

Figure 4A:
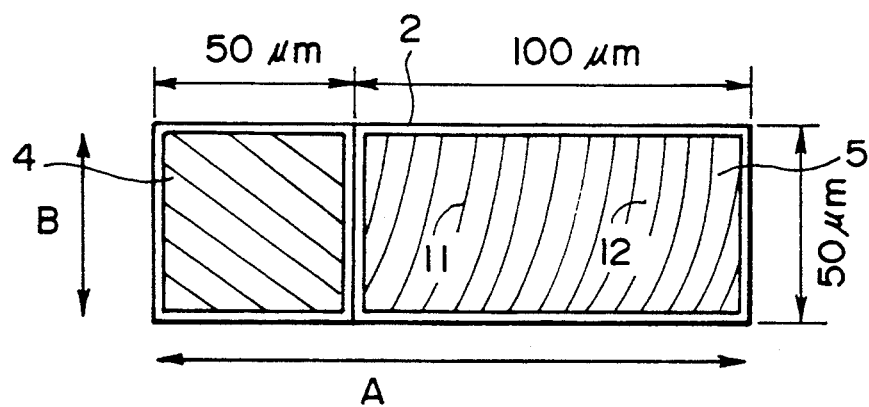
FIG. 4A is a plan view of a used physical optic element.
Figure 4B:
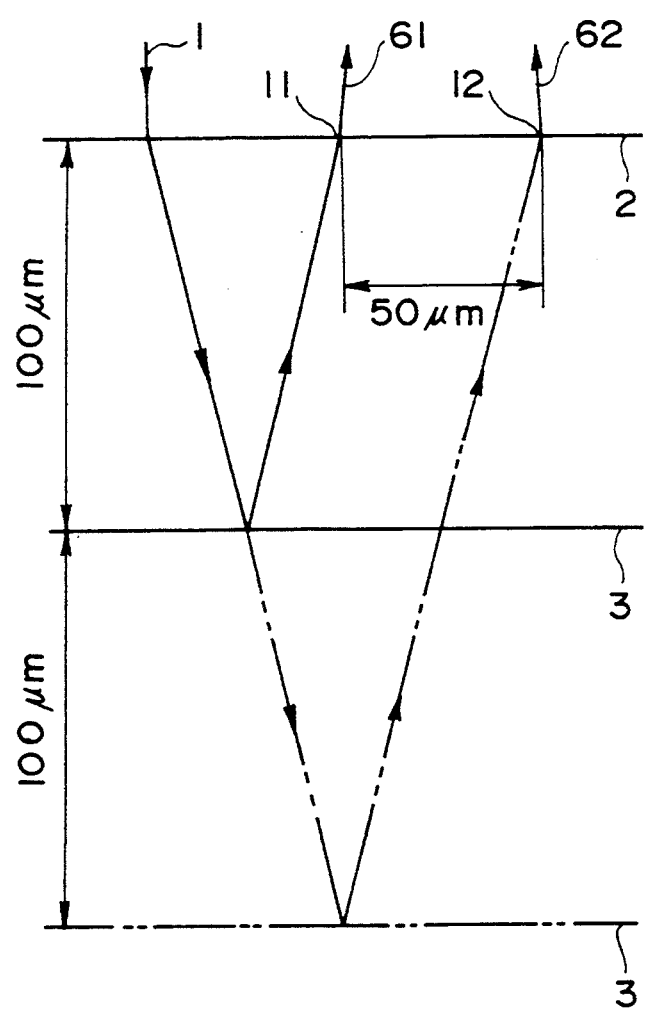
FIG. 4B is a representation of an optical path as viewed in the direction of an arrow B.
Figure 4C:
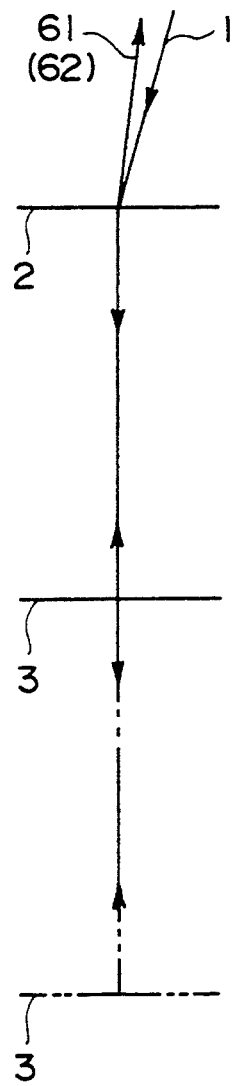
FIG. 4C is a representation of an optical path as viewed in the direction of an arrow A.

Referring to FIGS. 4A–4C explicating the function of the first and second Fresnel zone plates 4 and 5 of the mask 2 in relation to the interval between the mask 2 and the wafer 3, FIG. 4A is a top plan view of the Fresnel zone plates (physical optic elements) 4 and 5, FIG. 4B is a schematic representation of optical paths passing through the physical optic elements 4 and 5, as seen from the direction B, and FIG. 4C is a similar optical path view but as seen from the direction A.

In this embodiment, the first Fresnel zone plate 4 has a function simply of deflecting received light. However, it may have a light converging or diverging function.

As seen in FIGS. 4A–4C, the second Fresnel zone plate 5 is so structured that the direction of diffraction varies with the position on the second Fresnel zone plate. For example, a point 11 corresponds to such a point which is passed by the center of gravity of an emanating light when the interval between the mask 2 and the wafer 3 is 100 microns. As the interval between the mask 2 and the wafer 3 increases, the point passed by the emanating light shifts rightwardly in FIG. 4A and, when the interval becomes equal to 200 microns, the emanating light passes a point 12.

Each Fresnel zone plate has a pattern which, in this embodiment, has no power (light converging or diverging power) in the direction B, as viewed in FIG. 4A. However, the Fresnel zone plate may have a power for allowing adjustment of light.

In this embodiment, the second Fresnel zone plate 5 has a light converging power in the direction A, such that a light emanating therefrom at an angle of emission of 5 degrees is focused at a distance $f_M$ (FIG. 2) = 1000 microns.

Where, in the example of FIGS. 4A–4C, the interval measurement range for a mask and a wafer is 100–200 microns, for example, the size of the area of each Fresnel zone plate 4 or 5 is set so as to be coordinated with the measurement range.

Referring back to FIG. 2, the manner of detecting the interval between a mask 2 and a wafer 3 will be described in greater detail.

Where, as shown in FIG. 2, the distance to the mask 2 from the point F of intersection between a diffraction light 61 and a diffraction light 62 is denoted by $f_M$, the following relations are determined:

$$AD = 2d_0 \tan\theta 1, \quad (1)$$

$$AE = 2(d_0 + d_G)\tan\theta 1,$$

$$\therefore d_M = DE = AE - AD = 2d_G \tan\theta 1$$

The amount of shift S of light incident on the surface of the light receiving means 8, as the gap between the mask and the wafer changes from $d_0$ to $d_G$, is given by the following equation:

$$S = 2 \cdot f_S \cdot \tan\theta 2 \quad (3)$$

It follows from equations (1), (2) and (3) that:

$$S = 2 \cdot d_G \cdot f_S / f_M \cdot \tan\theta 1 \quad (4)$$

The amount of deviation ($\Delta S$) of light incident on the surface of the light receiving means 8 resulting from a unit change in the gap between the mask 2 and the wafer 3, namely, the sensitivity $\Delta S$ can be expressed as follows:

$$\Delta S = S/d_G = (2 \cdot f_S/f_M) \cdot \tan\theta 1 \quad (5)$$
$$= f_S/f_M \cdot d_M/d_G$$

In this embodiment, by detecting shift or positional deviation S of the light incident on the surface of the light receiving means 8, the distance $d_G$ is detected in accordance with equation (4) and, by using the detected value $d_G$, an error in the wafer 3 position with respect to a reference position (P1) which is at a predetermined or desired interval with respect to the mask 2, to thereby measure an actual interval between the mask 2 and the wafer 3.

The position of incidence upon the light receiving means 8 of the light from the second Fresnel zone plate 5, as the wafer 3 is at a desired interval $d_0$, is used as a reference position as seen from the foregoing description. Such reference position can be easily determined in preparation. For example, a suitable means may be used to set a wafer exactly at a predetermined interval ($d_0$) from a mask, and light may be projected from the light source LD. Thus, such position on the light receiving means 8 at which the light from the second Fresnel zone plate 5 impinges may be determined as the reference position. As an example, for the setting of the wafer, a measuring apparatus "TM-230N" (trade name; manufactured by Canon Inc. Japan) may be conveniently used.

The sensitivity $\Delta S$ in this embodiment, provided that the focal length $f_S$ of the condensing lens 7 is 30 mm, can be derived from equation (5), that is:

$$\Delta S = (30000/1000)(50/100) = 15(\mu m/\mu m)$$

Thus, per a change of 1 micron in the interval between the mask 2 and the wafer 3, the light incident on the surface of the light receiving means 8 displaces 15 microns. Where a PSD having a position resolving power of 0.3 micron is used as the light receiving means, in principle the interval between the mask and the wafer can be measured with a resolution of 0.02 micron.

In the present embodiment, as described, the first Fresnel zone plate 4 has a function for deflecting a received light. This provides the following advantageous results. That is, as seen from equation (5), the angle $\theta 1$ of the light emanating from the first Fresnel zone plate 4 is one of the parameters which determine the sensitivity $\Delta S$. Provided that the Fresnel zone plate 4 is dismounted so that a light simply transmitted by the mask is used, the angle $\theta 1$ is exactly equal to the angle of incidence of light received by the mask, namely it is exactly in the direction of projection of light from a used light source. In that case, the disposition of light source means is limited to attain a desired sensitivity $\Delta S$. The provision of a first Fresnel zone plate 4 having a light deflecting function does allow that, for any angle of incidence upon the Fresnel zone plate of a light from a light source, the angle of emission of light emanating from the Fresnel zone plate is easily adjusted to a desired value $\theta 1$ by means of the Fresnel zone plate itself. As a result, the degree of freedom in disposition of a light source means is high.

Further, the diameter of a light impinging on the Fresnel zone plate 4 may preferably made slightly larger than the size of the Fresnel zone plate 4. In that case, any displacement of a light incident on the mask surface along the plane of the mask surface does not cause a change in the state of light emanating from the Fresnel zone plate 4.

In this embodiment, a diffraction light from the second physical optic element 5 which diffraction light is determined with respect to a single position on the wafer 3, is surely incident on the condensing lens 7 at a particular angle with respect to the optical axis 63. Since the light receiving means 8 is provided at the focal point position of the condensing lens 7, the position of incidence of light upon the light receiving means 8 is unchangeable, independently of the position of the optical probe 10 on the optical axis 63 and, additionally, independently of a slight displacement of the optical probe in a direction perpendicular to the optical axis 63. As a result, an error in measurement due to any deviation of the optical probe can be suppressed sufficiently.

If, on the other hand, a positional error of the optical probe 10 to some extent is allowable or where a specific means is provided to compensate for such a positional error, it is not necessary to so exactly dispose the light receiving means 8 at the focal point position of the condensing lens 7.

Figure 5A:
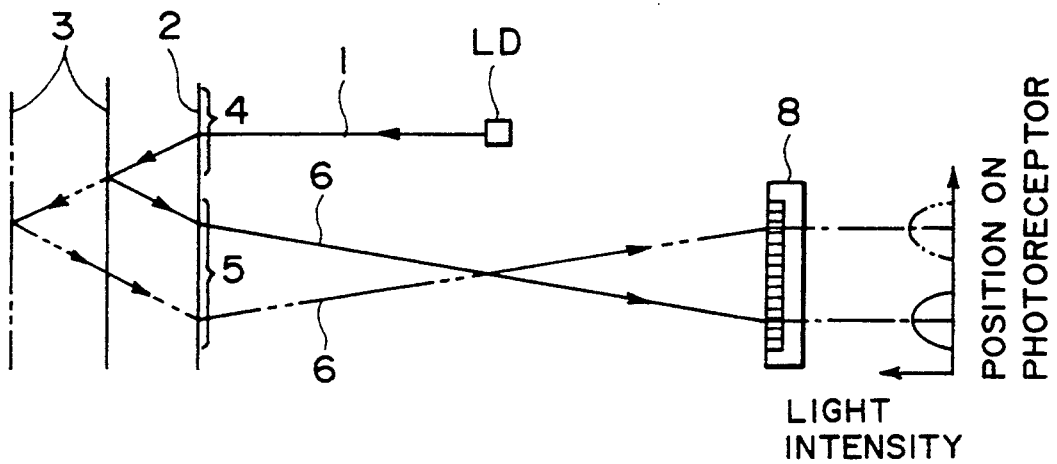
FIG. 5A is a schematic illustration of an optical arrangement according to a second embodiment of the present invention.
Figure 5B:
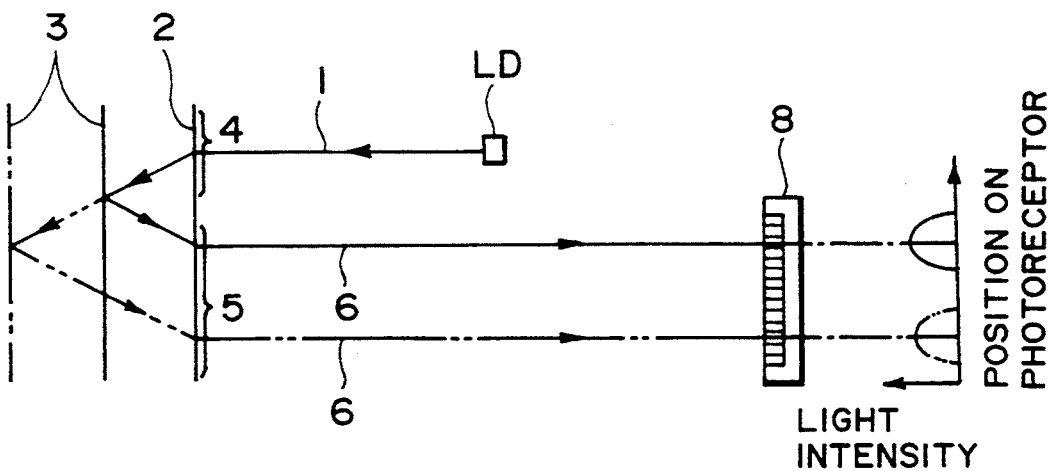
FIG. 5B is a schematic representation of an optical arrangement according to a third embodiment of the present invention.

The condensing lens 7 of the FIG. 2 embodiment may be omitted and, in place of this, the optical arrangement may be modified such as illustrated in FIG. 5A or 5B. Substantially the same effects are attainable in each case, although the diameter of a light spot incident on the light receiving means 8 is slightly larger as compared with the FIG. 2 embodiment. Of these cases, FIG. 5A represents an example in which the condensing lens 7 of the FIG. 2 embodiment is simply omitted with a slight modification of the position of the light receiving means 8. FIG. 5B represents an example wherein a physical optic element 5 such as one used in the FIG. 5A example is replaced by one which has an optical function for emitting a received light in a determined direction but which has no light converging function. More particularly, in this example, a diffraction grating comprising a grating formed by parallel linear patterns of regular intervals may be used, for example, as the physical optic element 5. In that case, like the FIG. 5A embodiment, substantially the same advantageous effects are attainable as in the FIG. 2 embodiment.

As a further alternative, in the FIG. 5B embodiment, the diffraction grating 5 may be omitted so that the reflection light from the wafer 3 simply passes the mask 2, while the light receiving means may be disposed at a suitable position to receive the light passing the mask 2. Further, a light-receiving side diffraction grating 4 in each of the FIG. 5A embodiment and the FIG. 5B embodiment may be omitted. In that case, light from a light source LD impinges on the mask 2 at an incline with respect to a normal to the mask surface. Additionally, in FIGS. 5A and 5B, a diffraction grating may be provided in a portion of the wafer 3, such that the diffracted light from the diffraction grating 4 is diffracted again by that diffraction grating of the wafer 3 toward the second diffraction grating 5 of the mask.

Figure 6:
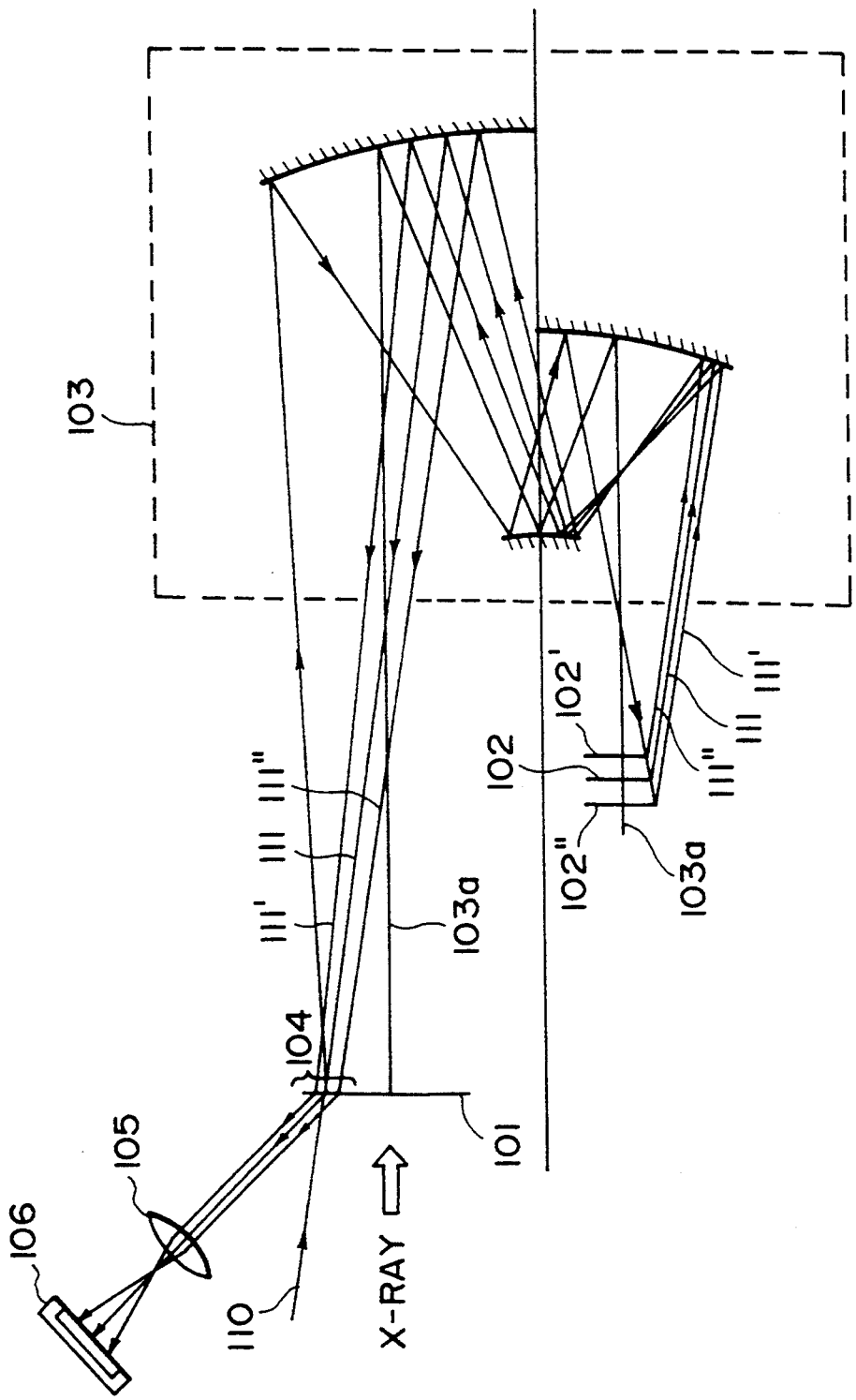
FIG. 6 is a schematic representation of an optical arrangements according to a fourth embodiment of the present invention.

FIG. 6 is a schematic representation of an optical arrangement according to another embodiment of the present invention, wherein the invention is applied to an X-ray mirror reduction optical system in a semiconductor microcircuit device manufacturing exposure apparatus.

Denoted in FIG. 6 at 101 is a transmission type mask; denoted at 102, is a wafer which is at a focus position of a reduction optical system; denoted at 102' and 102'', are wafers which are at defocused positions, is respectively; denoted at 103, is an X-ray mirror reduction optical system; denoted at 104, is a diffraction grating provided in a portion of the mask 101 and comprising linear patterns of regular intervals; denoted at 105, is a light receiving lens; denoted at 106, is a photoelectric converting element such as a CCD; denoted at 110, is a light (X rays) supplied from an unshown radiation energy source; denoted and at 111, is 111' and 111'', is are returning lights reflected by the wafer when it is at the positions 102, 102 ' and 102'' respectively. The X rays projected upon the mask 101 in the direction of an arrow advance along an optical axis 103a of the reduction optical system and irradiate the wafer 102 surface. By this, a pattern formed on the mask 101 can be transferred onto the wafer 102.

In accordance with the defocused position (102' or 102") as assumed by the wafer 102 at that time, the position of incidence of a returning light upon the diffraction grating 104 of the mask 101 displaces. The amount of displacement of the position of incidence of light upon the photoelectric converting element 106 is substantially in a proportional relationship with the amount of displacement of the position of the wafer 102 in the direction of the optical axis 103a.

Where the wafer is at the focus position 102, the reflected light from the wafer will be incident at a predetermined reference position on the sensor 106. On the other hand, if the wafer is at any defocus position, the reflected light from the wafer will be collected at a position shifted from the reference position. The amount of shift in that case is substantially proportional to the amount of the shift of the wafer position. Thus, by measuring the amount of shift of the position of the light incident of the photoelectric converting device 106 from the reference position, the amount of shift of the wafer position (i.e. the amount of defocus) can be detected. The reference position can be easily determined in preparation by trial printing of a wafer or wafers, for example. Alternatively, since the focus position of a used projection optical system can be determined at a predetermined distance from the end face of the projection lens system, for example, the reference position may be determined first by bringing a wafer to the position of the predetermined distance by using a suitable wafer position detecting means and second by determining the position of the wafer-reflected light incident in that occasion upon the sensor 106 as the reference position.

The light receiving lens 105 functions to project upon the photoelectric converting element 106 the light coming back from the diffraction grating 104. The photoelectric converting element 106 functions to execute signal processing for detecting any difference in light quantity of left hand and right hand spots. On the basis of the thus detected differential signal, the wafer position can be detected. In accordance with the sign of the resultant differential signal, a wafer stage (not shown) is moved in the direction of the optical axis of the reduction optical system to control the focus adjustment.

Where a used mask 101 is a reflection type mask, the projection of light upon the first physical optic element 104 is made on the right hand side (X ray emission side) as viewed in FIG. 6 and, additionally, the sensing portion (light receiving lens and photoelectric converting element) is also disposed on the same side.

FIG. 7 is a schematic representation of an optical arrangement according to a further embodiment of the present invention, wherein the invention is applied to an ultraviolet ray reduction optical system in a semiconductor microcircuit device manufacturing exposure apparatus.

Denoted in FIG. 7 at 101 is a mask (reticle); denoted at 102, is a wafer which is at a focus position of a reduction optical system; denoted at 102' and 102", are wafers which are at defocus positions, is respectively; denoted at 103', is a ultraviolet-ray reduction optical system (projection lens system); denoted at 104, is a diffraction grating provided in a portion of the mask 101; denoted at 105, is a light receiving lens; denoted at 106, is a photoelectric converting element; denoted at 110, is a light supplied from an unshown light source and being projected upon the diffraction grating 104; denoted and at 111, 111' and 111", are returning lights reflected by the wafer as it is at positions 102, 102' and 102", respectively.

If the positioned mask and wafer are exactly in an optically conjugate relationship (namely, the wafer is exactly at a focus position), provided that the wavelength of the light 110 is the same as that of the ultraviolet ray used for the pattern printing, the position of the returning light incident upon the mask 101 coincides with the position of incidence of the light 110, coming from the unshown light source. If, however, different wavelengths are used, the returning light coming back from the wafer is incident on the mask 101 at a position shifted from the position of incidence of the light 110 by an amount corresponding to the chromatic aberration. In that case, such a position being shifted is determined at a reference position corresponding to the in-focus state of the wafer. A diffraction grating may be provided at such position to deflect the light toward the photoelectric converting element 106.

The interval measuring system of the present embodiment can be called a "TTL (through the lens) type" wherein the interval measurement is made by passing an interval measuring light through a reduction optical system. Thus, by using the same wavelength of light for the interval measurement and for the pattern printing, it is easily possible to surely retain a constant position of incidence of a light spot upon the photoelectric converting element, corresponding to the in-focus state of a wafer to a mask, independently of any change in the focal length of the reduction optical system due to heat or otherwise.

It will be readily understood that in the arrangements according to the embodiments of FIGS. 6 and 7, any slight inclination of a wafer does not cause an error in the measurement of the interval.

Figure 8:
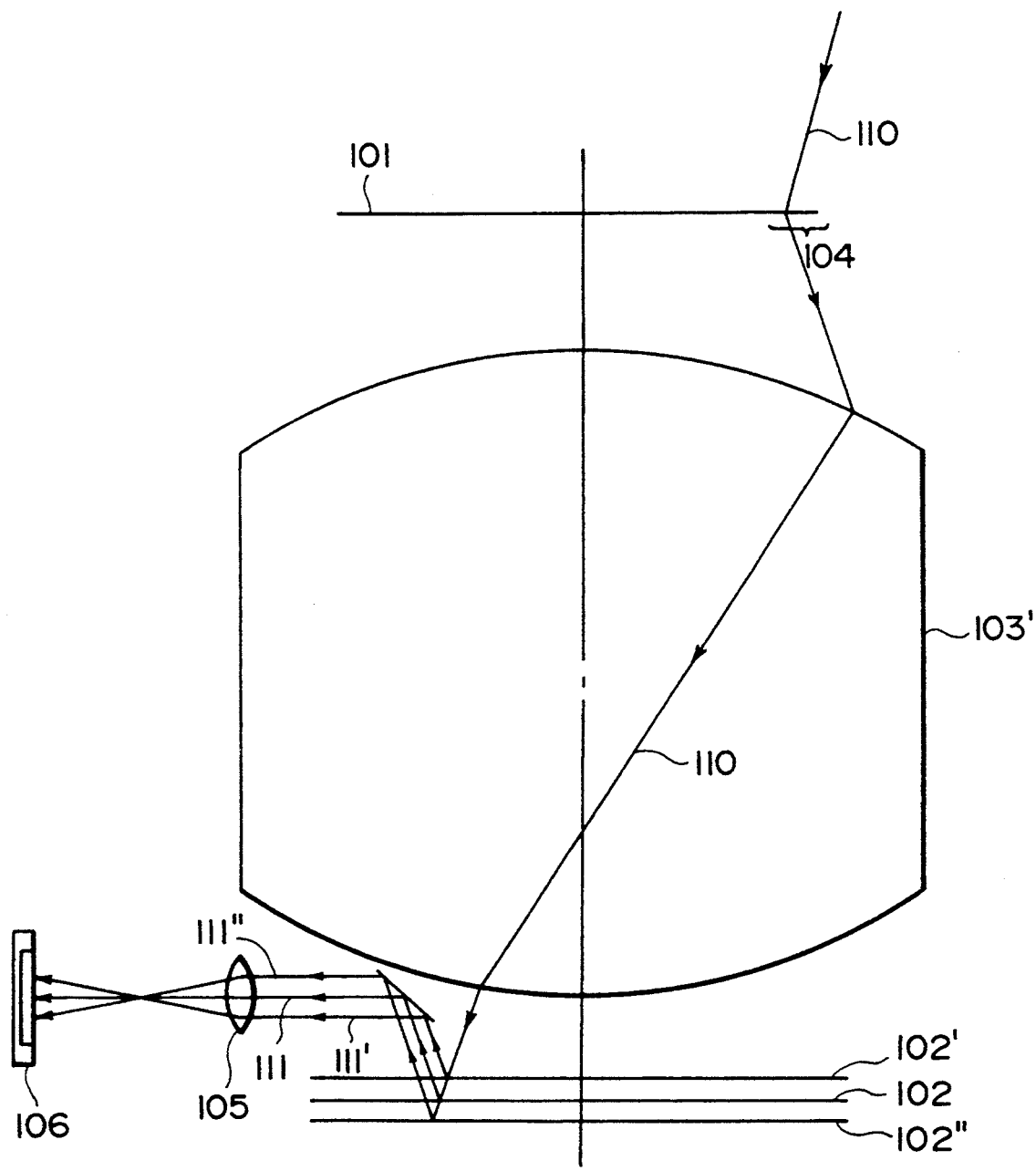
FIG. 8 is a schematic representation of an optical arrangement according to a sixth embodiment of the present invention.

FIG. 8 is a schematic representation of an optical arrangement according to a yet another embodiment of the present invention, wherein the invention is applied to a ultraviolet-ray reduction optical system in a semiconductor microcircuit device manufacturing exposure apparatus, similar to the FIG. 7 embodiment. Like numerals as in FIG. 7 are assigned to similar or corresponding elements.

In this embodiment, a light receiving lens 105 functions to project upon a photoelectric converting element 106 such a light reflected from a wafer but not passing again a reduction optical system 103. Where any wafer surface inclination has been corrected during a preceding wafer process, the optical conjugate relationship between the mask and the wafer can be retained with the illustrated structure. If, however, there occurs any wafer inclination, an error results. This can be corrected by detecting such a wafer inclination with the arrangement shown in FIG. 9.

More specifically, there are provided a half mirror 107 and an additional photoelectric converting element 108 such as a PSD sensor or a CCD sensor which is of a type that the position of incidence of a received light can be discriminated. The photoelectric converting device 108 is disposed at a focal point position of the lens 105 (more exactly, at a position which is optically equivalent to the focal point position).

Figure 9:
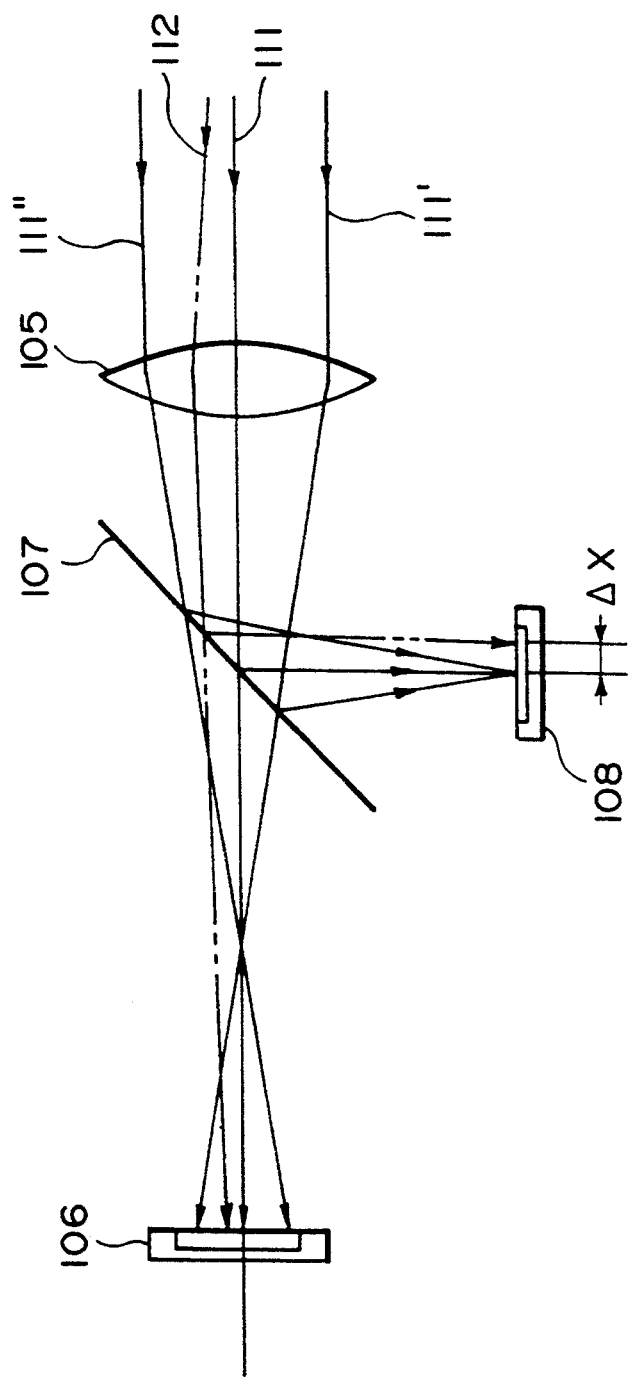
FIG. 9 is a schematic representation, illustrating details of an inclination detecting means used in the FIG. 8 embodiment.

In the system shown in FIG. 9 and provided that the wafer does not have an inclination, if the light 111 from the wafer shifts by parallel displacement due to a change in the wafer position, as depicted at 111' or 111", the light impinges always at the same point on the photoelectric converting device 108 surface. If however the wafer inclines, the angle of the light 111 reflected from the wafer changes as depicted at 112, for example, such that the position of incidence of the wafer-reflected light upon the photoelectric converting device 108 shifts by an amount $\Delta x$ which can be determined by the following equation:

$$\Delta x = \Delta a \cdot f_1$$

wherein $\Delta a$ is the amount (rd) of change in angle and $f_1$ is the focal length of the lens 105. By using this $\Delta x$, the position of light upon the position detecting photoelectric converting device 106 can be correctly compensated for.

More specifically, since $\Delta x$ is proportional to $\Delta x'$ which represents the amount of shift of the light 111 incident upon the photoelectric converting device 106 as resulting from the same inclination of the wafer, a true value $S_0$ can be detected first by detecting in preparation a constant k of proportion regarding that proportional relationship, that is, $\Delta x' = k \cdot \Delta x$, and second by subtracting $k \cdot \Delta x$ from the amount $S_1$ of the displacement of the light upon the photoelectric converting device 106. Namely:

$$S_0 = S_1 - k \cdot \Delta x$$

From the detected value $S_0$, it is possible to correctly detect an amount of defocus without being affected by the inclination.

Figure 10A:
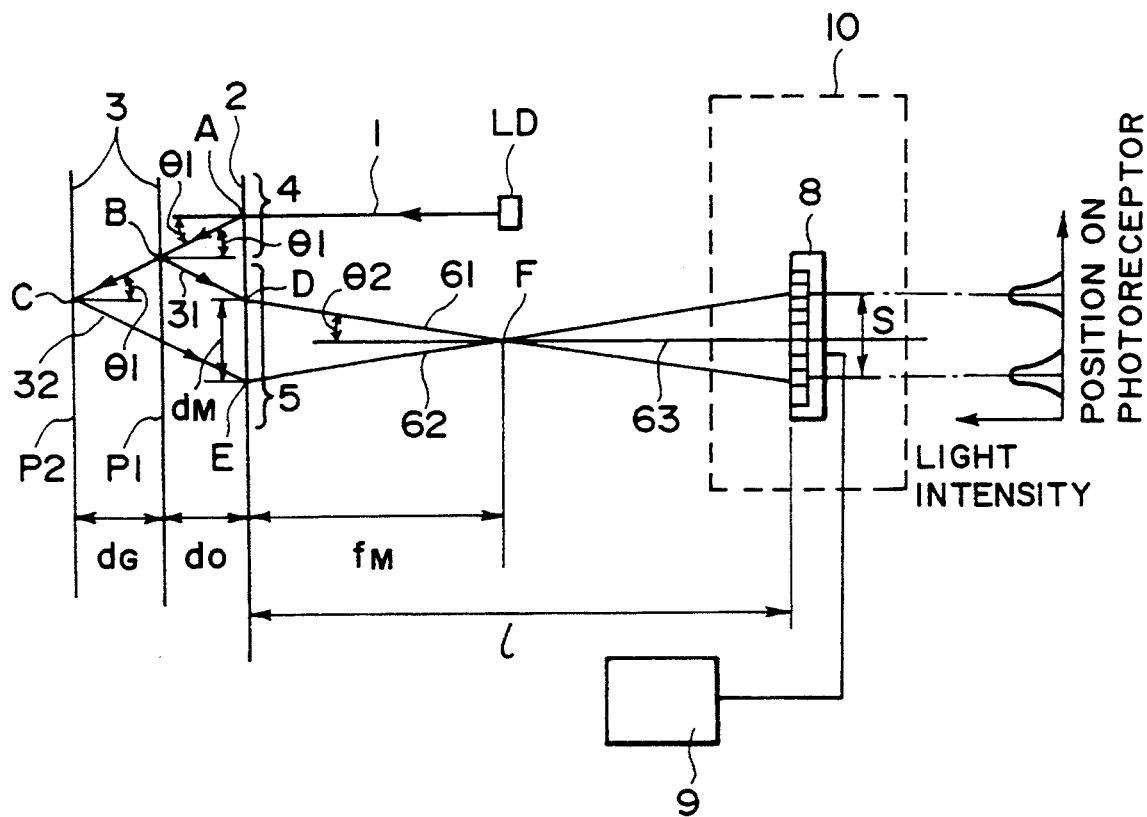
FIG. 10A is a schematic representation of an optical arrangement according to a seventh embodiment of the present invention.
Figure 10B:
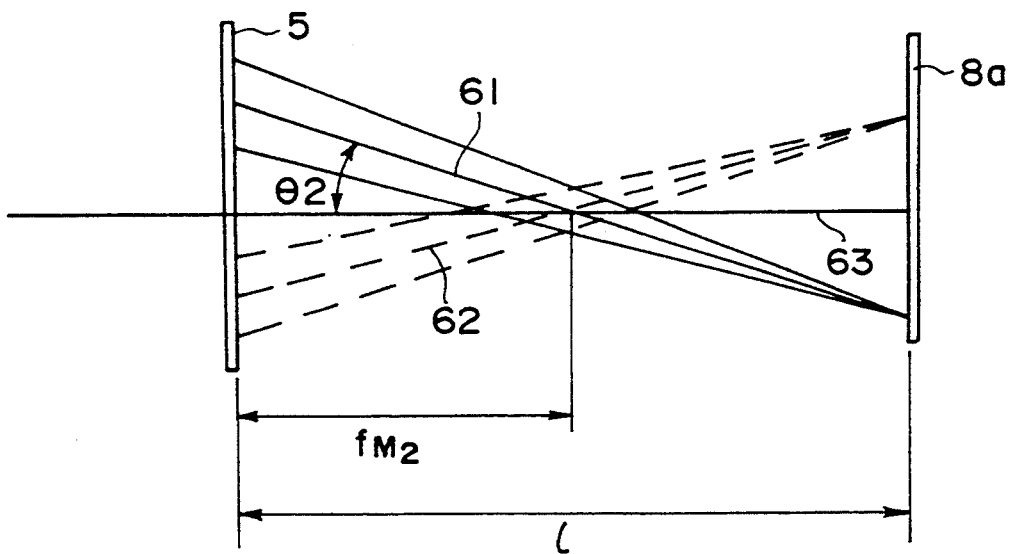
FIG. 10B is an enlarged schematic view showing a portion of the FIG. 10A embodiment.

FIG. 10A is a schematic representation of an optical arrangement according to seventh embodiment of the present invention. FIG. 10B is an enlarged view schematically showing a portion of the optical path as defined by the optical arrangement of FIG. 10A. Like numerals as in FIG. 2 are assigned to corresponding or similar elements.

In the present embodiment, each of physical optic elements 4 and 5 is provided by a Fresnel zone plate having a light converging or diverging function.

For convenience of explanation, it is now assumed that the focal length of the second Fresnel zone plate 5 is $f_{M2}$ (micron) (wherein the value of $f_{M2}$ may be either positive or negative); denoted the distance from the second Fresnel zone plate 5 to a light evaluation plane 8a which corresponds to a sensor 8 surface is l; the diameter of light upon the second Fresnel zone plate 5 is $\omega_1$; denoted the diameter of light upon the light evaluation plane 8a is $\omega_2$; denoted and the light projected upon the second Fresnel zone plate 5 is a parallel light. Then, geometo-optically the beam diameter $\omega_2$ can be given by:

$$\omega_2 = \omega_1 \times (l - f_{M2})/f_{M2}$$

Thus, the diameter $\omega_2$ is very large if $l >> f_{M2}$.

In consideration of this, in the present embodiment, the refracting powers of the first and second Fresnel zone plates 4 and 5 are so set that, when the mask 2 and the wafer 3 are disposed exactly at a preset interval d, the light from the second Fresnel zone plate 5 is imaged upon a single point on the light evaluation plane 8a, as illustrated in FIG. 10B, so as to reduce the diameter $\omega_2$ on the evaluation plane 8a to ensure high-precision detection of the position of the center of gravity of light by the sensor 8a.

More particularly, the components are so set that, where the focal length of the first Fresnel zone plate is denoted by $f_{M1}$ (micron), the following relation is satisfied:

$$1/(-f_{M1} + 2d) + 1/l = 1/f_{M2}$$

It should be noted that, when the reduced beam diameter $\omega_1$ is so small as of an order of the wavelength of the interval measuring light, it is necessary to treat the beam diameter wave-optically.

Where the beam diameter is small, the actual beamwaist position comes nearer to the Fresnel zone plate 5 side, as compared with the geometo-optic focus position of the light. Such actual beam waist position is almost determined by the beam diameter and, therefore, the adjustment thereof is difficult to achieve. Also, if the difference between the beam waist diameter and the beam diameter at the geometo-optic focus position is so large that it can not be practically disregarded as being null, it means that the beam waist position is close to the Fresnel zone plate 5. Thus, it is difficult to define the light evaluating plane at this position.

In that case, where as illustrated in FIG. 11 the radius of curvature of the wave surface of the light from the second Fresnel zone plate 5 is denoted by $R_1$; the distance of the beam waist of the light at that time from the Fresnel zone plate 5 is denoted by $X_1$; the beam waist diameter is denoted by $\omega_0$; the distance from the beam waist to the evaluation plane 8a is denoted by $x_2$; the beam diameter upon the evaluation plane 8a is $\omega_2$; and the radius of curvature of the wave surface upon the light evaluation plane 8a is denoted by $R_2$ and provided that the light has a Gaussian distribution, then the following relations are derived:

$$\omega_0^2 = \omega_1^2 / [1 + (\pi \omega_1^2 / 4 \lambda R_1)^2] \quad \text{(a)}$$

$$X = R_1 / [1 + (4 \lambda R_1 / \pi \omega_1^2)^2] \quad \text{(b)}$$

$$\omega_2^2 = \omega_0^2 [1 + (4 \lambda X_2 / \pi \omega_0^2)^2] \quad \text{(c)}$$

$$R_2 = X_2 [1 + (\pi \omega_0^2 / 4 \lambda X_2)^2] \quad \text{(d)}$$

Detecting the beam diameter $\omega_2$ from equations (a), (b), (c) and (d) while changing the radius of curvature $R_1$, the beam diameter $\omega_2$ becomes minimum when $R_1 \approx l$, namely when the plane 8a is substantially at the geometo-optic focus position.

As an example, the values of beam diameter $\omega_2$ as assumed when l = 20000 microns, $\omega_1$ = 20, 50, 100 and 200 microns are those as shown in Table 1.

TABLE 1

| Beam Diameter $\omega_2$ on Evaluation Plane (l = 20000 microns) | | | | |
|---|---|---|---|---|
| | $\omega_2$ (microns) | | | |
| | $\omega_1$ | | | |
| $R_1$ | 20 | 50 | 100 | 200 |
| 1000 | 1123 | 1040 | 1912 | 3801 |
| 2000 | 1072 | 617 | 924 | 1803 |
| 5000 | 1058 | 449 | 367 | 609 |
| 10000 | 1057 | 426 | 234 | 226 |
| 20000 | 1057 | 423 | 211 | 106 |
| 50000 | 1057 | 424 | 220 | 160 |
| 100000 | 1057 | 425 | 226 | 192 |
| ∞ | 1057 | 426 | 234 | 226 |

It is seen in Table 1 that the diameter $\omega_2$ becomes minimum when $R_1 \approx 1$. In consideration of this, in the present embodiment, the value $f_{M1}$ is so set as to satisfy the relation "$R_1 \approx 1$" where the expansion of the beam diameter $\omega_2$ upon the sensor 8a surface is treated wave-optically.

FIGS. 12A and 12B are schematic representations, illustrating in development views, optical paths arranged in accordance with an eighth and ninth embodiments of the present invention. Reference numeral 161 denotes light. A wafer used is omitted in these drawings.

FIG. 12A shows an example wherein each of a light-reception side first Fresnel zone plate 4 and a light-emission side second Fresnel zone plate 5, both being provided in a portion of a first object 2, has a light converting function or a convex-lens function.

FIG. 12B shows an example wherein a light-reception side first Fresnel zone plate 4 has a convex-lens function, while a light-emission side second Fresnel zone plate 5 has a diverging or concave-lens function. In either case, substantially the same advantageous results as by the FIG. 10A embodiment are attainable.

FIGS. 13A–13C are schematic representations, illustrating in development views the optical paths defined in accordance with a tenth, eleventh and twelfth embodiments of the present invention.

In these embodiments, upon a light-reception side first Fresnel zone plate 4 of a first object 2, light is incident in different states.

FIG. 13A shows an example wherein a converging light is incident on the first Fresnel zone plate 4. At this time, the first Fresnel zone plate 4 functions as a concave lens, while the second Fresnel zone plate 5 functions as a convex lens.

FIG. 13B shows an example wherein a divergent light is incident upon a first Fresnel zone plate 4. At this time, the first Fresnel zone plate 4 functions as a concave lens, while the second Fresnel zone plate 5 functions as a convex lens.

FIG. 13C shows an example wherein a parallel light is incident upon a first Fresnel zone plate 4. At this time, it functions as a concave lens, while the second Fresnel zone plate 5 functions as a convex lens. Reference numeral 162 denotes wave surface of the light. In this embodiment, as shown in FIG. 13C, the shape of the first or second Fresnel zone plate is so set as to cancel any wavefront aberration when a light having such wavefront aberration is incident thereupon. Thus, it is possible to arrange a Fresnel zone plate for correction of aberration of a received light.

While the invention has been described with reference to the structures disclosed herein, it is not confined to the details set forth and this application is intended to cover such modifications or changes as may come within the purposes of the improvements or the scope of the following claims.

What is claimed is:

1. A device for measuring an interval between first and second objects, comprising:
   means for projecting light to the first object;
   means for detecting the position of incidence, upon a predetermined surface, of light having been deflected by a first diffraction grating of the first object, having been reflected by the second object and then having been deflected by a second diffraction grating of the first object; and
   means for determining the interval between the first and second objects on the basis of the detection by said detecting means.

2. A device according to claim 1, wherein said second diffraction grating has a lens function.

3. A method of measuring a gap between a mask and a wafer, comprising:
   a first step of irradiating light upon the mask and the wafer;
   a second step of detecting a position of incidence, upon a predetermined surface, of the light deflected first by one of the mask and the wafer and second by the other of the mask and the wafer; and
   a third step of detecting the gap between the mask and the wafer on the basis of the detection of the position of the incidence of the light.

4. A method according to claim 3, further comprising a step of providing the mask with a diffraction grating, wherein at said second step the light diffracted by said diffraction grating and reflected by the surface of the wafer is detected.

5. A device for measuring a gap between a mask and a wafer, comprising:
   light source means for projecting a light upon the mask and the wafer;
   photodetecting means for detecting the position of incidence, upon a predetermined surface, of a light projected by said light source means and being deflected first by one of the mask and the wafer and second by the other mask and the wafer; and
   gap detecting means for detecting the gap between the mask and the wafer on the basis of the detection by said photodetecting means.

6. A device according to claim 5, wherein said photodetecting means detects a light having been refracted by the mask and deflected by the wafer and, then, collected by the mask.

7. A device according to claim 6, wherein said photodetecting means includes an optical system for collecting light emanating from the mask, and detecting means provided at a focal point position of said optical system, for detecting the position of incidence of the light.

8. A device according to claim 7, wherein said photodetecting means is disposed substantially at such a position at which light having been converged or diverged by the mask, having been reflected by the wafer and having been converged or diverged again by the mask is focused, when the mask and the wafer are at a predetermined interval.

9. An exposure apparatus for printing a pattern of a mask on a wafer, said apparatus comprising:
   optical means for projecting to the mask exposure radiation from a radiation source, to print the mask pattern on the wafer; and
   measuring means for measuring the spacing between the mask and the wafer, said measuring means comprising (i) light source means for projecting light upon the mask and the wafer, (ii) photodetecting means for detecting the position of incidence, upon a predetermined plane, of the light projected by said light source means and being deflected first by one of the mask and the wafer and second by the other of the mask and the wafer and (iii) determining means for determining the spacing between the mask and the wafer on the basis of the detection of the position of incidence of the light upon the predetermined plane by said photodetecting means.

10. An apparatus according to claim 9, further comprising means for adjusting the positional relationship between the mask and the wafer on the basis of the measurement by said measuring means.

11. An apparatus according to claim 9, wherein the radiation source comprises an X-ray generating source.

12. An apparatus according to claim 9, wherein the radiation source comprises an ultraviolet light generating source.

13. An apparatus according to claim 9, wherein the mask pattern comprises a circuit pattern for manufacture of a semiconductor device.

14. An exposure apparatus for printing on a wafer a pattern of a mask having first and second diffraction gratings, said apparatus comprising:
optical means for projecting to the mask exposure radiation from a radiation source, to print the mask pattern on the wafer; and
measuring means for measuring the spacing between the mask and the wafer, said measuring means comprising (i) projecting means for projecting light to the mask, (ii) detecting means for detecting the position of incidence, upon a predetermined plane, of the light deflected by the first diffraction grating of the mask, reflected by the wafer and then deflected by the second diffraction grating of the mask and (iii) determining means for determining the spacing between the mask and the wafer on the basis of the detection of the position of incidence of the light upon the predetermined plane by said detecting means.

15. An apparatus according to claim 14, wherein the second diffraction grating has a lens function.

16. An apparatus according to claim 10, further comprising means for adjusting the positional relationship between the mask and the wafer on the basis of the measurement by said measuring means.

17. An apparatus according to claim 10, wherein the radiation source comprises an X-ray generating source.

18. An apparatus according to claim 10, wherein the radiation source comprises an ultraviolet light generating source.

19. An apparatus according to claim 10, wherein the mask pattern comprises a circuit pattern for manufacture of a semiconductor device.

20. A semiconductor device manufacturing method, comprising the steps of:
measuring the spacing between a mask and a wafer by (i) irradiating the mask and the wafer with light, (ii) detecting the position of incidence, upon a predetermined plane, of the light deflected first by one of the mask and the wafer and second by the other of the mask and the wafer and (iii) determining the spacing between the mask and the wafer on the basis of the detection of the position of incidence of the light upon the predetermined plane; and projecting radiation to the mask to print a circuit pattern of the mask on the wafer.

21. A method according to claim 20, wherein said measuring step further comprises providing the mask with a diffraction grating, and said step of detecting the position of incidence of the light comprises detecting light diffracted by the diffraction grating and reflected by the wafer.

22. A method according to claim 20, further comprising using X-rays as the radiation.

23. A method according to claim 20, further comprising using ultraviolet light as the radiation.

24. A semiconductor device manufactured by a method which comprises the steps of:
measuring the spacing between a mask and a wafer by (i) irradiating the mask and the wafer with light, (ii) detecting the position of incidence, upon a predetermined plane, of the light deflected first by one of the mask and the wafer and second by the other of the mask and the wafer and (iii) determining the spacing between the mask and the wafer on the basis of the detection of the position of incidence of the light upon the predetermined plane; and
projecting radiation to the mask to print a circuit pattern of the mask on the wafer.

25. A device for measuring a gap between first and second objects, comprising:
a light source for projecting light upon the first and second objects;
a photodetector for detecting the position of incidence, upon a detection surface, of the light, having been deflected by the second object and then having been deflected by a physical optic element of the first object; and
a signal processor for determining the gap between the first and second objects on the basis of the detection of the position of incidence of the light upon the detection surface by said photodetector.

26. A device according to claim 25, wherein said physical optic element has a lens function.

27. A semiconductor device manufacturing system, comprising:
an alignment system for aligning a mask and a wafer, said alignment system comprising (i) a light source for projecting light upon the mask and the wafer, (ii) a photodetector for detecting the position of incidence, upon a detection surface, of the light, having been deflected by the wafer and then having been deflected by a physical optic element of the mask and (iii) a signal processor for determining the gap between the mask and the wafer on the basis of the detection of the position of incidence of the light upon the detection surface by said photodetector; and
a printing system for printing a pattern of the mask on the wafer.

28. A semiconductor device manufacturing method, comprising the steps of:
providing a mask having a pattern, and a wafer;
aligning the mask and the wafer by (i) projecting light upon the mask and the wafer, (ii) detecting the position of incidence, upon a detection surface, of the light having been deflected by the wafer and then having been deflected by a physical optic element of the mask, (iii) determining the gap between the mask and the wafer on the basis of the detection of the position of incidence of the light upon the detection surface by said photodetector and (iv) aligning the mask and the wafer on the basis of the detected gap; and
printing the pattern of the mask on the wafer.

29. A semiconductor device manufactured by a method which comprises:
providing a mask having a pattern, and a wafer;
aligning the mask and the wafer by (i) projecting light upon the mask and the wafer, (ii) detecting the position of incidence, upon a detection surface, of the light, having been deflected by the wafer and then having been deflected by a physical optic element of the mask, (iii) determining the gap between the mask and the wafer on the basis of the detection of the position of incidence of the light upon the detection surface by said photodetector and (iv) aligning the mask and the wafer on the basis of the detected gap; and printing the pattern of the mask on the wafer.

30. A microdevice manufactured by a method which comprises the steps of:

measuring the spacing between a mask and a wafer by (i) irradiating the mask and the wafer with light, (ii) detecting the position of incidence, upon a predetermined plane, of the light deflected first by one of the mask and the wafer and second by the other of the mask and the wafer and (iii) determining the spacing between the mask and the wafer on the basis of the detection of the position of incidence of the light upon the predetermined plane; and projecting radiation to the mask to print a circuit pattern of the mask on the wafer.

31. A microdevice manufacturing system, comprising:

an alignment system for aligning a mask and a wafer, said alignment system comprising (i) a light source for projecting light upon the mask and the wafer, (ii) a photodetector for detecting the position of incidence, upon a detection surface, of the light, having been deflected by the wafer and then having been deflected by a physical optic element of the mask and (iii) a signal processor for determining the gap between the mask and the wafer on the basis of the detection of the position of incidence of the light upon the detection surface by said photodetector; and a printing system for printing a pattern of the mask on the wafer.

32. A microdevice manufacturing method, comprising the steps of:

providing a mask having a pattern, and a wafer;

aligning the mask and the wafer by (i) projecting light upon the mask and the wafer, (ii) detecting the position of incidence, upon a detection surface, of the light, having been deflected by the wafer and then having been deflected by a physical optic element of the mask, (iii) determining the gap between the mask and the wafer on the basis of the detection of the position incidence of the light upon the detection surface by said photodetector and (iv) aligning the mask and the wafer on the basis of the detected gap; and printing the pattern of the mask on the wafer.

33. A microdevice manufactured by a method which comprises:

providing a mask having a pattern, and a wafer;

aligning the mask and the wafer by (i) projecting light upon the mask and the wafer, (ii) detecting the position of incidence, upon a detection surface, of the light, having been deflected by the wafer and then having been deflected by a physical optic element of the mask, (iii) determining the gap between the mask and the wafer on the basis of the detection of the position of incidence of the light upon the detection surface by said photodetector and (iv) aligning the mask and the wafer on the basis of the detected gap; and printing the pattern of the mask on the wafer.

34. A method according to claim 4, wherein said diffraction grating has a lens function.

* * * * *

UNITED STATES PATENT AND TRADEMARK OFFICE
CERTIFICATE OF CORRECTION

PATENT NO. : 5,343,291
DATED : August 30, 1994
INVENTOR(S) : MITSUTOSHI OHWADA ET AL.

It is certified that error appears in the above-indentified patent and that said Letters Patent is hereby corrected as shown below:

On cover page, item [56]

UNDER "U.S. PATENT DOCUMENTS"

"Ishisashi et al." should read --Ishibashi et al.--.

COLUMN 1

Line 16, "suitably" should read --suitable--.

COLUMN 2

Line 19, "arrangements" should read --arrangement--.

COLUMN 4

Lines 39-40, "$\therefore d_M = DE = AE - AD = 2d_G \tan\theta 1$" should read --$\therefore d_M = DE = AE - AD = 2d_G \tan\theta 1$
$\therefore d_M = 2 \cdot f_M \cdot \tan\theta 2 \quad (2)$--.

COLUMN 5

Line 52, "preferably" should read --preferably be--.

COLUMN 6

Line 65, "is" (second occurrence) should be deleted; and
Line 67, "102" " should read --102",--

UNITED STATES PATENT AND TRADEMARK OFFICE
CERTIFICATE OF CORRECTION

PATENT NO. : 5,343,291
DATED : August 30, 1994
INVENTOR(S) : MITSUTOSHI OHWADA ET AL.

It is certified that error appears in the above-indentified patent and that said Letters Patent is hereby corrected as shown below:

COLUMN 7

Line 64, "is" should be deleted; and
Line 65, "a" should read --an--.

COLUMN 8

Line 22, "such" should read --such a--.

COLUMN 9

Line 4, "If however" should read --If, however,--;
Line 48, "denoted" should be deleted;
Line 52, "denoted" should be deleted; and
Line 53, "denoted" should be deleted.

COLUMN 12

Line 35, "refracted" should read --deflected--; and
Line 36, "deflected" should read --reflected--.

Signed and Sealed this

Fourteenth Day of March, 1995

Attest:

BRUCE LEHMAN

*Attesting Officer*    *Commissioner of Patents and Trademarks*